United States Patent [19]

Ovshinsky et al.

[11] Patent Number: 4,645,715
[45] Date of Patent: Feb. 24, 1987

[54] COATING COMPOSITION AND METHOD

[75] Inventors: Stanford R. Ovshinsky, Bloomfield Hills; John E. Keem, Grosse Pointe Park; James D. Flasck, Rochester; Richard C. Bergeron, Romulus; John E. Tyler, Detroit, all of Mich.

[73] Assignee: Energy Conversion Devices, Inc., Troy, Mich.

[21] Appl. No.: 359,098

[22] Filed: Mar. 17, 1982

Related U.S. Application Data

[63] Continuation-in-part of Ser. No. 304,889, Sep. 23, 1981, abandoned.

[51] Int. Cl.$^4$ .................. B32B 9/00; B32B 15/04
[52] U.S. Cl. .................. 428/469; 428/698; 428/701
[58] Field of Search .............. 428/469, 698, 699, 701; 427/38

[56] References Cited

U.S. PATENT DOCUMENTS

| | | | |
|---|---|---|---|
| 2,309,371 | 1/1943 | Wissler | 29/95 |
| 2,311,878 | 2/1943 | Schlumpf | 76/101 |
| 3,553,905 | 1/1971 | Lemelson | 51/206 |
| 3,663,316 | 5/1972 | Kulmburg | 148/36 |
| 3,774,703 | 11/1973 | Sanderson | 117/75 |
| 3,832,219 | 8/1974 | Nelson et al. | 117/93.3 |
| 3,900,636 | 8/1975 | Curry et al. | 427/38 |
| 3,915,757 | 10/1975 | Engel | 148/6 |
| 4,094,764 | 6/1978 | Boucher et al. | |
| 4,108,751 | 8/1978 | King | |
| 4,177,474 | 12/1979 | Ovshinsky | |
| 4,231,816 | 11/1980 | Cuomo et al. | |
| 4,236,946 | 12/1980 | Aboaf et al. | |
| 4,447,263 | 5/1984 | Sugizawa et al. | 428/698 X |
| 4,522,844 | 6/1985 | Khanna et al. | |

FOREIGN PATENT DOCUMENTS 1588950 5/1978 United Kingdom .
2075551 5/1981 United Kingdom .

OTHER PUBLICATIONS

*Patent Abstracts of Japan*, unexamined applications, C field, vol. 5, No. 28, Feb. 20, 1981, The Patent Office Japanese Government, p. 120 C44, Application Nos. 54-61647 and 54-61648.

*Patent Abstracts of Japan*, unexamined applications, C field, vol. 5, No. 31, Feb. 25, 1981, The Patent Office Japanese Government, p. 141 C45; Application No. 54-65281.

*Patent Abstracts of Japan*, unexamined applications, C field, vol. 5, No. 41, Mar. 18, 1981, The Patent Office Japanese Government, p. 72 C47; Application No. 54-72827.

*Primary Examiner*—Nancy A. B. Swisher
*Attorney, Agent, or Firm*—James D. Ryndak; Lawrence G. Norris; Richard M. Goldman

[57] ABSTRACT

Coatings and methods for forming same are provided. Generally, the coatings are wear resistant disordered coatings of at least one nonmetallic element and a transition metal that are deposited on an article surface, such as a tool surface or other surface that is subjected to wear or friction. The resulting tools generally exhibit increased life with excellent lubricity thereby improving the surface finish of workpieces machined therewith.

Adherence coatings are provided for achieving improved adherence of the wear resistant coating to the substrate.

30 Claims, 3 Drawing Figures

COATING COMPOSITION AND METHOD

RELATED APPLICATION

This application is a continuation-in-part application of application Ser. No. 304,889, filed Sept. 23, 1981 now abandoned.

BACKGROUND

This invention relates to coatings and more particularly to coatings on surfaces that are subjected to friction or wear and to coatings for tools utilized for cutting, forming and grinding.

In the past, tools have been fabricated to achieve various hardness, lubricity and wear characteristics by controlling certain parameters. For example, tools for working and shaping unhardened steels may be fabricated from steel containing enough carbon to form very hard martensite. In more complicated compositions, varying the carbon content and alloy content makes possible non-deforming steels, shock-resistant steels, hot-work steels, or high-speed steels. In some of these steels, alloying elements such as titanium, vanadium, molybdenum, tungsten and chromium are used. These are elements which have a great affinity for carbon and form hard, wear-resistant metallic carbides. However, in many cases, it is desirable to provide a tool having a coating on the surface thereof to improve the hardness and/or lubricity of the tool. This is especially the case where it is desired to lengthen the tool life or where it is necessary to shape and work hardened steel. However, many types of wear resistant coatings require high temperatures for application, thereby making them impractical for use on many types of substrate materials, since the properties of the substrate may change significantly under such temperatures. Other types of coatings do not adhere sufficiently to the substrate under working conditions.

Thus, a need exists for wear resistant coatings that can be applied at relatively low temperatures to avoid significant change of substrate properties. A need exists for wear resistant coatings for articles such as tools to provide improved properties of hardness and lubricity thereby resulting in longer tool life and an improved surface finish of parts machined therewith. A need also exists for wear resistant coatings that have improved adhesion properties and resistance to fracture.

SUMMARY OF THE INVENTION

In accordance with a broad aspect of the invention, it has been discovered that coatings of disordered materials provide excellent resistance to wear. Tools and other articles which are subject to wear, such as a result of contact with other surfaces, can be coated with disordered material to increase the useful life of the tool or article. The wear resistant coatings contain a transition metal or alloy thereof (by alloy thereof is meant that the coating can contain more than one transition metal) and at least one nonmetallic element. Boron is an especially suitable nonmetallic element for use in accordance with the invention and carbon, nitrogen and oxygen are examples of other nonmetallic elements which may be suitable.

Generally, suitable transition metals are those of Groups IIIB through VIB, rows 4 through 6, of the periodic table (scandium, titanium, vanadium, chromium, yttrium, zirconium, niobium, molybdenum, hafnium, tantalum and tungsten). Especially useful transition metals include molybdenum, yttrium, zirconium, tungsten and alloys thereof. It is anticipated that other transition metals may also be useful for wear resistant coatings in accordance with the invention.

The wear resistant coatings are formed on the surface of an article such as a tool or other substrate and preferably comprise a coating containing boron and a transition metal or alloy of transition metals.

Tools coated in accordance with the invention utilizing boron as the nonmetallic element generally have excellent hardness and lubricity characteristics which result in increased lifetimes and depending on the particular application, improved surface finishes on parts or workpieces machined therewith.

The disordered wear resistant coatings can be amorphous, polycrystalline (and lacking long range compositional order), microcrystalline or a mixture of any combination of those phases.

Generally, the composition of the coatings is:

$$M_x N_{1-x},$$

where "M" represents the transition metal or transition metal alloy, "N" represents the at least one nonmetallic element and "x" and "1−x" represent the relative amount of metal and nonmetallic element, respectively, present in the coating, "x" being less than one. Preferably, "x" is less than or equal to about 0.5 for coatings containing boron. Thus, included in accordance with the present invention are coatings which are non-stoichiometric as well as those that are. Advantageously, the coatings of the present invention are disordered when formed. It is believed that disordered wear resistant coatings perform better than single phase crystalline coatings. Disordered coatings may be more susceptible than single phase crystalline coatings to diffusive bonding between the substrate surface and the coating, resulting in better adherence. Disordered materials also lack extended lattice planes through which fractures can propagate and in general can withstand relatively high deformation forces without fracture. Such materials are generally less susceptible to corrosion than single phase crystalline materials. It is believed that the foregoing advantages are more fully realized with amorphous or substantially amorphous coatings.

Nonstoichiometric wear resistant coatings can be utilized in which the coating composition can be tailor made to achieve desired characteristics while avoiding the formation of extended lattice planes which could adversely affect the adherence, wear resistance or other properties of the coating.

Any suitable method to form the coatings can be used. One method of forming the coatings is by sputtering. In particular, the sputter deposited disordered coatings in accordance with the present invention containing boron result in unexpected beneficial properties including increased resistance to wear and excellent lubricity, to provide an improved surface finish of parts machined therewith. Since sputtering can take place at relatively low substrate temperatures (generally about 200° C. or less, for example), the coatings can be formed while avoiding significant changes in the properties of the substrate material while providing a surface that has increased resistance to wear and excellent lubricity. Accordingly, the invention is particularly useful for coating materials such as tool steel and tungsten carbide, for example, since the processing temperature does not degrade the properties of these materials. Sputtering at low substrate temperatures also allows formation of the coatings in a disordered state.

The coatings can be applied to a tool surface or substrate surface without significantly changing the dimensions of the tool since the thickness of the coating can be relatively thin and can be closely controlled. After a tool, with or without a coating, has been in use, a coating in accordance with the invention can be applied thereto, to achieve a desired tolerance or otherwise replace material that has been worn from the tool. Thus, the invention makes possible the reclamation of tools that would otherwise be discarded.

In accordance with another aspect of the present invention, a composite coating is utilized in which a first coating layer or adherence coating different from the wear resistant coating in structure or composition is applied to the tool surface or substrate surface for improving adherence of the previously described wear resistant coating, which is applied over the first coating layer. Generally, the first coating layer is vapor deposited and may be any material that improves adherence of the wear resistant coating and does not adversely affect the wear resistant coating to a significant degree. The first coating layer may be stoichiometric or non-stoichiometric and disordered or non-disordered. Generally, suitable compounds for adherence coatings include oxides, carbides and nitrides of those transition metals which readily form a multiplicity of stoichiometric boride, oxide, carbide or nitride compounds (such as oxides of titanium) or which form a wide range of non-stoichiometric compounds having the same structure (such as carbides of titanium within the atomic composition range of $Ti_{68-50}C_{32-50}$).

BRIEF DESCRIPTION OF THE DRAWINGS

The present invention can be more completely understood by reference to the accompanying drawings in which.

DETAILED DESCRIPTION

Figure 1:
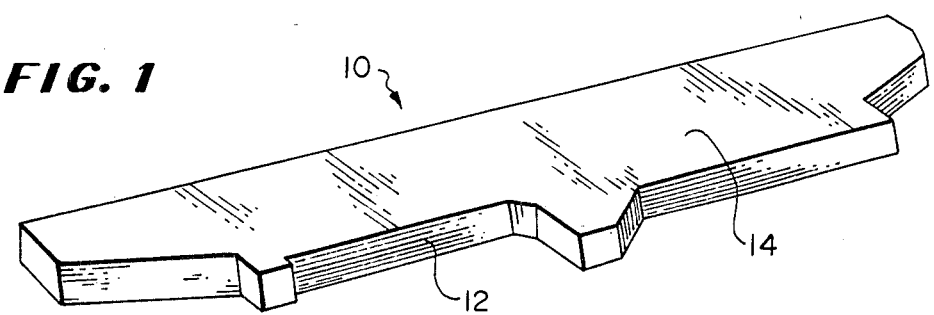
FIG. 1 is a perspective view of a tool coated in accordance with the present invention.

The wear resistant coatings in accordance with the present invention are preferably sputter deposited and advantageously are disordered. Sputter depositing techniques are well known to those skilled in the art and therefore a detailed description and explanation of sputtering techniques is not set forth herein. For example, suitable sputtering techniques, which are set forth as examples and not as limitations on the present invention include rf diode, rf magnetron and dc magnetron sputtering. If desired, a dc or rf bias may be applied to the substrate during application of the coating by sputtering. The bias may improve adhesion of the coating formed on the substrate, reduce stress in the coating and increase the density of the coating.

Prior to sputter depositing, it is generally important to provide an atomically clean surface on the portion of the tool or substrate surface that is to be coated (as used in this specification, "substrate" means that portion of a tool or substrate exclusive of a coating or coatings in accordance with the invention). This permits the formation of a uniform coating which adheres to the tool surface. There are several methods known to those skilled in the art for providing an atomically clean surface for sputtering and any such method may be utilized. The following surface preparation method is provided by way of example only and is not to be construed as a limitation upon the present invention.

In accordance with one method for providing an atomically clean tool surface, the tool is degreased with a chlorinated hydrocarbon degreaser. Thereafter, the tool is rinsed in methanol. The tool is then subjected to either plasma or acid etching. When plasma etching is utilized, preferably a fluorinated carrier gas, such as carbon tetrafluoride is utilized. The carrier gas decomposes and provides fluorine which cleans the surface of the tool. The final step for providing an atomically clean surface for the coating is to sputter etch in an argon plasma.

After an atomically clean surface has been provided on the tool or at least on that portion of the tool which is to be coated, the tool coating can be applied. It is usually desirable to form a tool coating that is between about one (1) and about eight (8) micrometers in thickness. However, it is understood that this is merely a preferred embodiment and not a limitation on the invention. Thus, thinner or thicker coatings may be formed to provide optimum results for a particular application. Tool coatings having a greater thickness may not be particularly desirable in applications where high tolerances must be maintained since the geometry and/or size of the tool and parts resulting therefrom may be altered.

In accordance with one preferred embodiment of the composition and method of the present invention, a wear resistant coating containing boron and a transition metal or alloy of transition metals is formed by sputtering. Generally, suitable transition metals and alloys include those from Groups IIIB through VIB, rows 4 through 6 of the periodic table. The preferred coatings generally have the composition:

$$M_xB_{1-x},$$

where "x" is less than or equal to about 0.5, "M" is the transition metal or transition metal alloy and "B" is boron. Especially useful transition metals include molybdenum, yttrium, zirconium, tungsten and alloys thereof. It is anticipated that coatings of boron and a transition metal or alloy thereof which are not "disordered" as defined herein can also be used as wear resistant coatings, although the disordered coatings are believed to have better properties, as previously described. While coatings having compositions outside of the aforementioned range can be utilized, it is believed that the best combination of hardness and lubricity is generally achieved with coatings having compositions within the range where "x" is less than or equal to about 0.5. As used throughout this specification, the term "lubricity" includes three aspects. One is a measure of friction between the tool and workpiece. The more "lubricious" a coating, the less friction there is between the tool and workpiece. Another aspect of lubricity is referred to as "edge build-up." More lubricious coatings have less of a tendency for chips and particles from the workpiece to adhere to the tool surface. The third aspect of "lubricity" relates to a surface effect at the interface between the tool and workpiece. A coating on the surface of a tool which forms a region at the edge of the workpiece that is compositionally different from the workpiece, such as by diffusion of a portion of the coating into the workpiece edge, can facilitate removal of material from the workpiece by the tool. In accordance with another aspect of the invention, a desired lubricity of a tool is achieved by controlling the ratio of metal to boron present in the metal boride coating that is applied to the tool substrate. Generally, it is believed that increasing the amount of boron will increase the lubricity. While not wishing to be bound by theory, one explanation is that when the tool is used, the operating temperatures that are encountered cause the boron to form an oxide which has a low coefficient of friction.

When it is desired to produce sputtered wear resistant amorphous coatings in accordance with the invention, generally the sputtering will take place at substrate surface temperatures of less than about 200° C. and usually at about 100° C. or even less, to assure formation of amorphous coatings. Thus, the coatings in accordance with the present invention can be formed at relatively low temperatures. The target generally is also cooled to prevent evaporation, melting or other unwanted degradation of the target. As a result, the coating is applied to a tool surface, for example, without significantly altering physical properties of the tool, such as the dimensions, hardness and transverse rupture strength. Generally, substrate temperatures, target compositions, deposition rates and gas pressures which prevent the formation of disordered coatings should be avoided.

In accordance with another embodiment of the present invention, a composite coating is provided on a substrate surface and comprises a first coating or adherence coating different in structure or composition from the wear resistant coating. The adherence coating is applied to the substrate and improves adherence of the wear resistant coatings previously described. Any coating which improves adherence of the wear resistant coating and does not significantly adversely affect the wear resistant coating can be utilized. The adherence coating is generally greater than or equal to about 500 angstroms in thickness and may be amorphous or crystalline. One range of thickness for the adherence coating is 500–1000 angstroms, for example. Generally, the adherence coating will be vapor deposited, usually by sputtering. Low temperature chemical vapor deposition could also be used, for example. Thereafter, a wear resistant coating as previously described is formed over the first coating. Sputtering in an oxygen or nitrogen containing atmosphere with a suitable metal target is one form of sputtering which can be utilized to form an adherence coating layer containing oxygen or nitrogen.

It is desirable that the adherence coating contain an element which has high atomic mobility (such as boron, carbon, nitrogen, oxygen) and a carrier element (such as a transition metal that can form a multiplicity of stoichiometric compounds or a wide range of non-stoichiometric compounds having the same structure). The combination of atoms with high mobility and a transition metal as described allows diffusion of high mobility atoms into the substrate, the wear resistant coating or the adherence coating while allowing the adherence coating to maintain its integrity.

One generally suitable type of adherence coating is a coating of at least one nonmetallic material from the group of oxygen, nitrogen, carbon or boron, and at least one transition metal which readily forms a multiplicity of stoichiometric compounds with the at least one nonmetallic material. The most preferred metals are titanium and vanadium. Iron is an example of another transition metal which readily forms a multiplicity of oxides. Boron alone may also be used as an adherence coating.

Another type of adherence coating is a coating of boron, oxygen, nitrogen or carbon with a transition metal that forms a wide range of non-stoichiometric compounds having the same structure (such as titanium carbide). For example, carbon and titanium form such non-stoichiometric compounds in the range of Ti (68–50 atomic percent) and C (32–50 atomic percent) while maintaining a TiC structure. Another suitable material is carbon and nitrogen which can form nonstoichiometric compounds having a TiN structure in the range of Ti (68–45 atomic percent) and N (32–55 atomic percent).

In accordance with a most preferred embodiment of the invention, the adherence or transition coating provided is a coating of titanium and oxygen that is applied to the tool surface substrate, preferably by sputtering. Preferably this coating is greater or equal to about 500 angstroms in thickness. The titanium and oxygen coating can be formed by sputtering in an oxygen containing atmosphere, for example, and may be amorphous or crystalline. Preferably, in accordance with this embodiment, the first coating will have the composition:

$$Ti_{1-x}O_x,$$

where x is from about 0.5 to about 0.66. The titanium and oxygen coating provides a transition layer for the wear resistant coating resulting in better adherence of the wear resistant coating to the tool. This adherence coating is especially useful for wear resistant coatings of boron and molybdenum. Non-stoichiometric proportions of titanium and oxygen are included in accordance with the invention. Since "x" is from about 0.5 to about 0.66 the compositions include TiO and $TiO_2$ and those oxides within this range. Preferred compositions can also be calculated for the other transition metals which readily form a multiplicity of oxides, carbides, nitrides or borides, the preferred composition range being bounded by the lowest and highest stoichiometric ratio for a particular transition metal and nonmetallic element.

It is to be understood that the coatings and methods described herein can be utilized on tools that have been subjected to use, either with or without the coatings described herein. For example, after a tool having a coating in accordance with the invention has been in use, and is either worn or outside of a desired tolerance range, the same type of coating or another type of coating in accordance with the invention can be applied to the tool, resulting in an increased tool life. Also, a coating can be applied to tools which did not previously have a coating of the invention thereon. Thus, tools which would otherwise be discarded can be reclaimed.

Referring now to the drawings in general and to FIG. 1 in particular, there is illustrated a form cutter tool 10 coated in accordance with the present invention. As shown in FIG. 1, form cutter tool 10 has a flank face 12 and a face 14. As is known to those skilled in the art, flank face 12 is that portion of the tool which directly contacts the part of workpiece being machined. Rake face 14 is contacted by the chip or particles as they are machined from the part or workpiece. Generally, it is not necessary to coat the rake face of a tool, but this can be done as desired.

Figure 2:
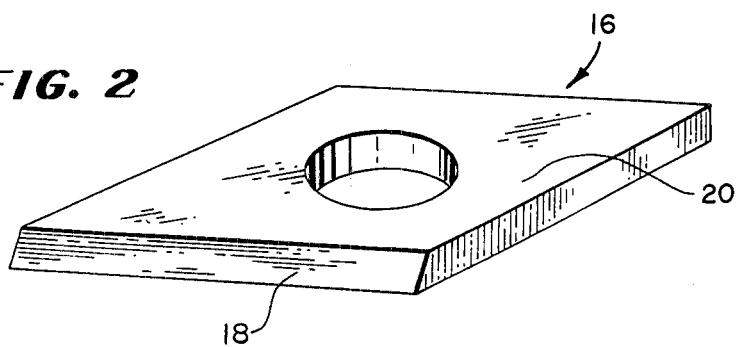
FIG. 2 is a perspective view of another tool coated in accordance with the present invention.

FIG. 2 is a perspective view of an insert tool 16 having a flank face 18 and a rake face 20. Insert tool 16 has been coated over its entire surface with a sputter deposited molybdenum boride coating in accordance with the invention.

Figure 3:
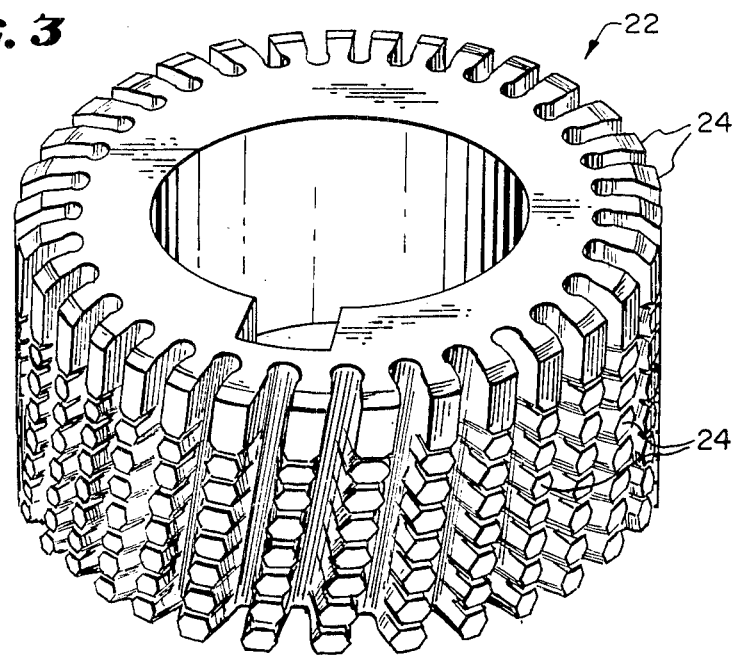
FIG. 3 is a perspective view of still another tool coated in accordance with the present invention.

FIG. 3 illustrates a gear shaver tool 22 which is composed of a plurality of radially extending teeth 24. Gear shaver tool 22 illustrates a relatively complexly shaped tool to which the method and tool coatings in accordance with the present invention are suitable.

Generally, the hardness of the coatings in accordance with the present invention is greater than about 1500 Knoop, as measured on crystalline bulk wear resistant coating material with a 1 kilogram force. Since the disordered coatings are relatively thin, direct measurement is impractical and crystalline material is relatively easily made in bulk. It is expected that the material is even harder when disordered. However, in addition to being relatively hard, the coatings of the present invention generally also exhibit excellent lubricity. As a result, tools in accordance with the present invention have increased life and the use of such tools can result in an improved surface finish on parts machined therewith.

The present invention and its advantages can be more completely understood from the following examples:

EXAMPLE 1

One face of a 5/16 inch square high-speed steel lathe tool was rf diode sputtered utilizing a target of $MoB_2$ that was formed by hot pressing $MoB_2$ powder. An amorphous coating of approximately 8.7 micrometers of molybdenum and boron was formed. A standard tool wear test was employed in which the flank face wear was measured as a function of cutting time on a four inch diameter piece of 1045 steel using surface speeds of 100 to 250 feet/minute, 0.060 inch depth of cut and 0.006 inch advance per revolution. When flank face wear reaches 0.010 inch, the tool is considered to be no longer useful. The molybdenum coating in accordance with the present invention exhibited a tool life about ten times greater than a high-speed steel lathe tool without a coating

EXAMPLE 2

Two carbide reamer tools were coated in accordance with the invention. Each tool was coated with an adherence coating of titanium and oxygen, followed by an amorphous coating of boron and molybdenum in accordance with the following procedure. The tools were cleaned in isopropyl alcohol and then sputter etched to provide an atomically clean surface. Thereafter, a coating of titanium and oxygen was formed by sputtering utilizing a titanium target. The sputtering atmosphere was argon gas with 5% oxygen at a pressure of about $7 \times 10^{-3}$ torr. A target power of 100 watts (about 3-4 watts per square inch of target) rf at 13.56 MHz was utilized. The tool was maintained at a temperature of between about 60° and 100° C. during the sputtering. The sputtering continued until a coating of titanium and oxygen was formed having a thickness of about 750 angstroms. Thereafter, an amorphous coating of molybdenum and boron was formed on each tool by sputtering utilizing a target formed by hot pressing molybdenum diboride powder. The sputtering parameters were the same as for the formation of the titanium and oxygen coating, except that argon gas was the sputtering atmosphere at a pressure of about $7 \times 10^{-3}$ torr.

The total coating thickness on one tool was 0.55 micrometers and 1.1 micrometers on the other tool.

Both tools were utilized to ream holes. After each tool reamed 825 holes they were reground and utilized for further reaming. A second regrind occurred after each tool reamed an additional 576 holes. One tool then reamed an additional 726 holes and the other reamed an additional 725 holes. The total number of holes reamed with each tool represents over a 200% increase compared with the amount typically obtainable with an uncoated reamer through two regrinds.

EXAMPLE 3

A tungsten carbide reamer that was first used while uncoated was reclaimed after use by depositing a wear resistant coating in accordance with the invention. After cleaning and sputter etching, an adherence layer of titanium and oxygen between about 500 and 1000 angstroms thick was deposited on the tool by the method set forth in Example 2. Thereafter, an amorphous coating of molybdenum and boron was applied, also by the method of Example 2. The total coating thickness on the tool provided an increase in the outer diameter by 2 micrometers.

The tool was reused and cut 389 pieces with no outer diameter wear and was reground. An uncoated tool will typically cut about 200 parts before its outer diameter wears by 0.0001 inch. After regrinding, the coated tool ran 100 pieces before its outer diameter wore by 0.0001 inch.

Coatings of materials other than set forth in the foregoing examples can be made using similar techniques and appropriately choosing the target material and reactive gas, if any, in the sputtering atmosphere. Also, multiple targets of different elements or compositions could be utilized. While the foregoing examples have shown production of the disordered coating materials by sputtering techniques, the invention is not so limited. Any method which produces a coating having the desired degree of disorder (amorphous, polycrystalline, microcrystalline or any combination thereof) can be utilized. By the term "amorphous" is meant a material which has long range disorder, although it may have short or intermediate order or even contain at times some crystalline inclusions.

It is to be understood that the coatings of the present invention are not limited to applications involving tools. The invention is useful on surfaces that may be subjected to friction or wear, including, for example, and not as a limitation on the invention, bearings, engine parts, fittings, and other devices where friction or wear is encountered.

While this invention has been described in relation to its preferred embodiments, it is to be understood that various modifications thereof will be apparent to those of ordinary skill in the art upon reading this specification and it is intended to cover all such modifications as fall within the scope of the appended claims.

We claim:

1. A wear resistant coating formed on a substrate comprising a wear resistant layer of disordered material consisting of at least one transition metal selected from the group consisting of hafnium, niobium, molybdenum, scandium, tantalum, titanium, vanadium, yttrium, and zirconium, and at least one nonmetallic element selected from the group consisting of boron, carbon, nitrogen and oxygen.

2. A coating as recited in claim 1 wherein said at least one transition metal is selected from the group consisting of yttrium, zirconium, molybdenum and tungsten.

3. A coating as recited in claim 1 wherein said at least one transition metal is molybdenum and said at least one nonmetallic element is boron, the coating having the composition $Mo_xB_{1-x}$ where x is less than or equal to 0.5.

4. A coating as recited in claim 1 wherein the coating is formed by sputtering.

5. A coating formed on a substrate comprising a wear resistant disordered layer consisting of boron and at least one transition metal selected from the group consisting of hafnium, niobium, molybdenum, scandium, tantalum, titanium, vanadium, yttrium and zirconium.

6. A coating as recited in claim 5 wherein said coating of boron and a metal is formed on a substrate by sputtering.

7. A coating as recited in claim 6 wherein said sputtering is rf diode sputtering, rf magnetron sputtering or dc magnetron sputtering.

8. A coating as recited in claim 7 wherein a bias potential is applied to the substrate during sputtering.

9. A coating as recited in claim 5 wherein said wear resistant coating is of a composition $M_xB_{1-x}$ where x is less than about 0.5M, is said at least one transition metal and is selected from the group consisting of molybdenum, yttriumm, zirconium and tungsten and B is boron.

10. A coating as recited in claim 5 wherein the coating is $MoB_2$.

11. A coating as recited in claim 5 wherein the coating is $Mo_xB_{1-x}$ where x is less than or equal to about 0.5.

12. A coating as recited in claim 6 wherein the substrate temperature during sputtering is less than about 200° C.

13. A coating as recited in claim 5 further comprising an adherence coating different from said wear resistant coating, between the substrate and said wear resistant coating, for improving adherence of the wear resistant coating, said adherence coating comprising at least one nonmetallic element selected from the group consisting of boron, carbon, oxygen and nitrogen and at least one transition metal which readily forms a multiplicity of stoichiometric compounds with said at least one nonmetallic element.

14. A coating as recited in claim 13 wherein said at least one transition metal present in said adherence coating is selected from the group consisting of titanium, vanadium and iron.

15. A coating as recited in claim 13 wherein the composition of said adherence coating is $Ti_{1-x}O_x$, where x is from about 0.5 to about 0.66.

16. A tool comprising:
(a) a substrate; and
(b) a wear resistant coating comprising a wear resistant layer of disordered material coating covering at least a portion of said substrate said layer consisting of at least one nonmetallic element selected from the group consisting of boron, carbon, nitrogen, and oxygen and at least one transition metal selected from the group consisting of scandium, titanium, vanadium, yttrium, zirconium, niobium, molybdenum, hafnium and tantalum.

17. A tool as recited in claim 16 wherein said at least one transition metal is selected from the group consisting of yttrium, zirconium, molybdenum and tungsten.

18. A tool as recited in claim 16 wherein said wear resistant coating is formed by sputtering.

19. A tool as recited in claim 18 wherein said sputtering is rf diode sputtering, rf magnetron sputtering or dc magnetron sputtering.

20. A tool as recited in claims 16 or 18 wherein said nonmetallic element is boron and said wear resistant coating is of the composition $M_xB_{1-x}$ where x is less than or equal to about 0.5M, represents said metal and B is boron.

21. A tool as recited in claims 16 or 18 wherein said wear resistant coating is $MoB_2$.

22. A coating as recited in claim 18 wherein said disordered material is substantially amorphous.

23. A tool as recited in claims 16 or 18 wherein said wear resistant coating is $Mo_xB_{1-x}$ where x is less than or equal to about 0.5.

24. A tool as recited in claim 18 wherein the substrate temperature during sputtering is less than about 200° C.

25. A tool as recited in claim 16 further comprising an adherence coating, different from said wear resistant coating, between the substrate and the wear resistant disordered coating for improving adherence of the wear resistant disordered coating to the substrate said adherence coating comprising at least one nonmetallic element selected from the group consisting of boron, carbon, nitrogen and oxygen and at least one transition metal which readily forms a multiplicity of stoichiometric compounds with said at least one nonmetallic element.

26. A tool as recited in claim 25 wherein said adherence coating transition metal is selected from the group consisting of titanium, vanadium, and iron.

27. A tool as recited in claim 25 wherein said adherence coating transition metal is titanium and the composition of said adherence coating is $Ti_{1-x}O_x$, where x is from about 0.5 to about 0.66.

28. A coating as recited in claim 27 wherein said disordered material is substantially amorphous.

29. A tool as recited in claim 16 further comprising an adherence coating, different from said wear resistant coating, between the substrate and the wear resistant coating for improving adherence of the wear resistant coating to the substrate, said adherence coating comprising at least one nonmetallic element selected from the group consisting of boron, carbon, nitrogen and oxygen and at least one transition metal which forms a wide range of non-stoichiometric compounds with said at least one nonmetallic element having the same structure.

30. A tool as recited in claim 25 wherein said adherence coating is formed by sputtering in an oxygen containing atmosphere.

* * * * *